(12) United States Patent
Stamper et al.

(10) Patent No.: US 7,861,204 B2
(45) Date of Patent: *Dec. 28, 2010

(54) STRUCTURES INCLUDING INTEGRATED CIRCUITS FOR REDUCING ELECTROMIGRATION EFFECT

(75) Inventors: Anthony Kendall Stamper, Williston, VT (US); Timothy Dooling Sullivan, Williston, VT (US); Ping-Chuan Wang, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 439 days.

This patent is subject to a terminal disclaimer.

(21) Appl. No.: 11/960,853

(22) Filed: Dec. 20, 2007

(65) Prior Publication Data

US 2009/0164964 A1 Jun. 25, 2009

(51) Int. Cl.
*G06F 17/50* (2006.01)
(52) U.S. Cl. .............................. 716/12; 716/13; 716/14; 716/17
(58) Field of Classification Search .................. 716/12, 716/13, 14, 17
See application file for complete search history.

(56) References Cited

U.S. PATENT DOCUMENTS

| | | | | |
|---|---|---|---|---|
| 5,084,824 A | * | 1/1992 | Lam et al. ....................... | 716/11 |
| 5,150,309 A | * | 9/1992 | Shaw et al. ..................... | 716/8 |
| 5,321,291 A | | 6/1994 | Redwine | |
| 5,657,242 A | * | 8/1997 | Sekiyama et al. ............. | 716/15 |
| 5,712,510 A | | 1/1998 | Bui et al. | |
| 5,900,735 A | | 5/1999 | Yamamoto | |
| 5,987,086 A | * | 11/1999 | Raman et al. ................... | 716/1 |
| 6,114,903 A | * | 9/2000 | Bach .......................... | 327/565 |
| 6,202,191 B1 | | 3/2001 | Filippi et al. | |
| 6,308,307 B1 | * | 10/2001 | Cano et al. ..................... | 716/8 |
| 6,342,733 B1 | | 1/2002 | Hu et al. | |
| 6,453,444 B1 | * | 9/2002 | Shepard ........................ | 716/2 |
| 6,489,684 B1 | | 12/2002 | Chen et al. | |

(Continued)

FOREIGN PATENT DOCUMENTS

EP            649204 A1  *  4/1995

OTHER PUBLICATIONS

Office Action (Mail Date Jan. 16, 2009) for U.S. Appl. No. 11/680,081, filed Feb. 28, 2007; Confirmation No. 4621.

(Continued)

*Primary Examiner*—Phallaka Kik
(74) *Attorney, Agent, or Firm*—Schmeiser, Olsen & Watts; Richard M. Kotulak (57) ABSTRACT

A design structure including an integrated circuit for reducing the electromigration effect. The IC includes a substrate and a power transistor which has first and second source/drain regions. The IC further includes first, second, and third electrically conductive line segments being (i) directly above the first source/drain region and (ii) electrically coupled to the first source/drain region through first contact regions and second contact regions, respectively. The first and second electrically conductive line segments (i) reside in a first interconnect layer of the integrated circuit and (ii) run in the reference direction. The IC further includes an electrically conductive line being (i) directly above the first source/drain region, (ii) electrically coupled to the first and second electrically conductive line segments through a first via and a second via, respectively, (iii) resides in a second interconnect layer of the integrated circuit, and (iv) runs in the reference direction.

5 Claims, 8 Drawing Sheets

U.S. PATENT DOCUMENTS

| | | |
|---|---|---|
| 6,500,706 B1 | 12/2002 | Chi |
| 6,717,268 B2 | 4/2004 | Hau-Riege |
| 6,747,307 B1 | 6/2004 | Vathulya et al. |
| 7,370,307 B2* | 5/2008 | Seta .................. 716/12 |
| 7,650,584 B2* | 1/2010 | Shiga et al. ............ 716/10 |
| 7,703,062 B2* | 4/2010 | Matsumoto et al. ......... 716/9 |
| 7,739,624 B2* | 6/2010 | McElvain et al. ............ 716/1 |
| 2003/0186543 A1 | 10/2003 | Jiang et al. |
| 2005/0006790 A1 | 1/2005 | Huang |
| 2005/0273748 A1* | 12/2005 | Hetzel et al. ............ 716/14 |
| 2006/0168551 A1* | 7/2006 | Mukuno ................. 716/5 |
| 2007/0198962 A1* | 8/2007 | Matsumoto et al. ........ 716/13 |
| 2008/0073673 A1* | 3/2008 | Shiga .................. 257/211 |
| 2008/0074929 A1* | 3/2008 | Shiga et al. ........... 365/185.17 |
| 2008/0111158 A1* | 5/2008 | Sherlekar et al. .......... 257/207 |
| 2008/0191309 A1* | 8/2008 | DeVries et al. .......... 257/506 |
| 2008/0283872 A1* | 11/2008 | Kubo et al. .......... 257/209 |
| 2009/0032846 A1* | 2/2009 | Ho .................. 257/207 |
| 2009/0193368 A1* | 7/2009 | McElvain et al. ............ 716/2 |
| 2009/0193379 A1* | 7/2009 | McElvain et al. ........... 716/12 |
| 2009/0193380 A1* | 7/2009 | McElvain et al. ........... 716/12 |
| 2009/0210848 A1* | 8/2009 | Cox .................. 716/12 |
| 2010/0022085 A1* | 1/2010 | Goebel et al. ............ 438/637 |
| 2010/0117162 A1* | 5/2010 | Rohrer et al. ............ 257/401 |

OTHER PUBLICATIONS

Office Action (Mail Date Jun. 3, 2009) for U.S. Appl. No. 11/680,081, filed Feb. 28, 2007; Confirmation No. 4621.

Notice of Allowance (Mail Date Oct. 6, 2009) for U.S. Appl. No. 11/680,081, filed Feb. 28, 2007, Anthony Kendall Stamper; Confirmation No. 4621.

\* cited by examiner

STRUCTURES INCLUDING INTEGRATED CIRCUITS FOR REDUCING ELECTROMIGRATION EFFECT

CROSS-REFERENCE TO RELATED APPLICATIONS

The present U.S. utility patent application is related to U.S. patent application Ser. No. 11/680,081, titled "Integrated Circuits For Reducing Electromigration Effect", filed Feb. 28, 2007 now U.S. Pat. No. 7,667,328.

FIELD OF THE INVENTION

The present invention relates generally to design structures including integrated circuits and more particularly to design structures including integrated circuits for reducing electromigration effect.

BACKGROUND OF THE INVENTION

In a conventional integrated circuit (IC), metal lines (having copper or aluminum as primary conductors) in the first interconnect layer of the IC are vulnerable to electromigration effect. Therefore, there is a need for an integrated circuit in which metal lines are less vulnerable to electromigration effect than those of the prior art.

SUMMARY OF THE INVENTION

The present invention provides a design structure including an integrated circuit, comprising (a) a substrate; (b) a first electrically conductive line segment and a second electrically conductive line segment on the substrate, wherein both the first and second electrically conductive line segments run in a reference direction, and wherein the first and second electrically conductive line segments reside in a first interconnect layer of the integrated circuit; and (c) an electrically conductive line electrically coupled to the first and second electrically conductive line segments through a first via and a second via, respectively, wherein the electrically conductive line resides in a second interconnect layer of the integrated circuit, wherein the second interconnect layer is above the first interconnect layer, and wherein the electrically conductive line runs in the reference direction.

The present invention provides a design structure including an integrated circuit, comprising (a) a substrate; (b) a first electrically conductive line segment, a second electrically conductive line segment, and a third electrically conductive line segment on the substrate; wherein the first, second, and third electrically conductive line segments reside in a first interconnect layer of the integrated circuit, and wherein the first, second, and third electrically conductive line segments run in a first reference direction; and (c) a first electrically conductive line and a second electrically conductive line, wherein the first and second electrically conductive lines reside in a second interconnect layer of the integrated circuit, wherein the first electrically conductive line is electrically coupled to the first and third electrical conductive line segments in the first interconnect layer through a first via and a second via, respectively, wherein the second electrically conductive line is electrically coupled to the second and third electrically conductive line segments in the first interconnect layer through a third via and a fourth via, respectively, wherein the second interconnect layer is above the first interconnect layer, wherein the first and second electrically conductive lines run in a second reference direction, and wherein the first and second reference directions are perpendicular.

The present invention provides an integrated circuit in which metal lines are less vulnerable to electromigration effect than those of the prior art.

The present invention provides a design structure including an integrated circuit in which metal lines are less vulnerable to electromigration effect than those of the prior art.

DETAILED DESCRIPTION OF THE INVENTION

Figure 1A:
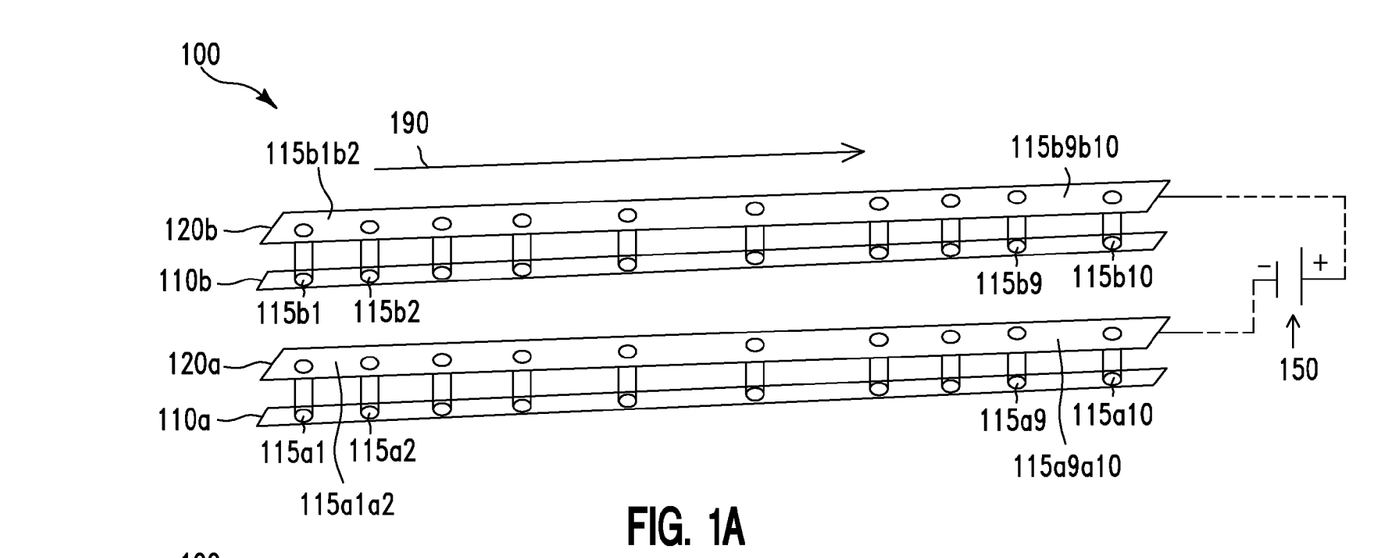
FIG. 1A depicts a design structure comprising a perspective view of a structure, in accordance with embodiments of the present invention.

FIG. 1A depicts a design structure comprising a perspective view of a structure 100, in accordance with embodiments of the present invention. The structure 100 comprises (i) a source region 110a and a drain region 110b of a power transistor (not shown) which can be formed on top of a semiconductor wafer (not shown), (ii) twenty contact regions 115, and (iii) two M1 lines 120a and 120b. The M1 line 120a comprises nine M1 line portions 115a1a2-115a9a10, and the M1 line 120b comprises nine M1 line portions 115b1b2-

115b9b10. The source region 110a is electrically coupled to the M1 line 120a through the ten contact regions 115a1-115a10. The drain region 110b is electrically coupled to the M1 line 120b through the ten contact regions 115b1-115b10. In one embodiment, the source region 110a and the drain region 110b comprise a doped semiconductor material (e.g., doped silicon); the twenty contact regions 115 comprise tungsten; and the two M1 lines 120 and 120b comprise copper. The source region 110a, the drain region 110b, and the two M1 lines 120a and 120b run in a first direction 190.

Figure 1B:
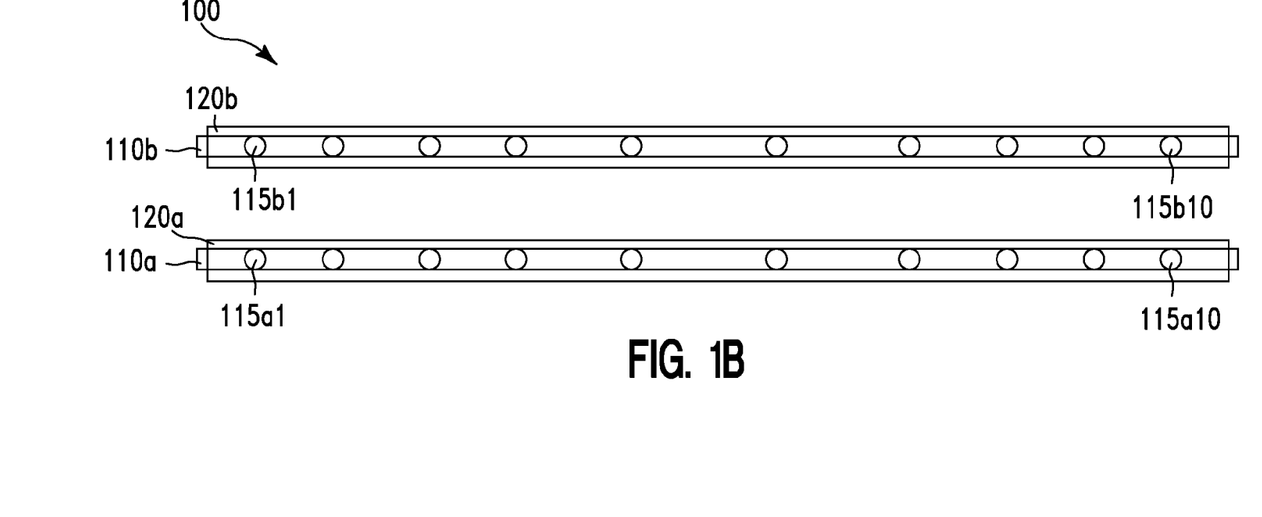
FIG. 1B depicts a design structure comprising a top down view of the structure of FIG. 1A, in accordance with embodiments of the present invention.

FIG. 1B depicts a design structure comprising a top down view of the structure 100 of FIG. 1A, in accordance with embodiments of the present invention.

With reference to FIGS. 1A and 1B, assume that there is a DC power supply 150 electrically connected to the structure 100 as shown. When the power transistor is conducting, the source region 110a and the drain region 110b are electrically connected together via a channel (not shown) of the power transistor which is located between the source region 110a and the drain region 110b. As a result, there is an electron current flowing in the structure 100. More specifically, the electron current flows from the DC power supply 150 to the M1 line 120a, then to the source region 110a through the ten contact regions 115a1-115a10, then to the drain region 110b via the channel, then to the M1 line 120b through the ten contact regions 115b1-115b10, and then back to the DC power supply 150.

It should be noted that the two M1 copper lines 120a and 120b are more vulnerable to electromigration effect than the twenty tungsten contact regions 115 because copper is more vulnerable to electromigration effect than tungsten. The electromigration effect is a phenomenon in which voids appear in an electrically conducting line due to an electron current flowing in the line exceeding a certain electron current density. The closer to the DC power supply 150 an M1 line portion is, the more vulnerable to electromigration effect that M1 line portion is. This is because the closer to the DC power supply an M1 line portion is, the higher current density that M1 line portion has to carry. For example, the M1 line portion 115a9a10 is more vulnerable to electromigration effect than the M1 line portion 115a1a2; similarly the M1 line portion 115b9b10 is more vulnerable to electromigration effect than the M1 line portion 115b1b2.

Figure 2A:
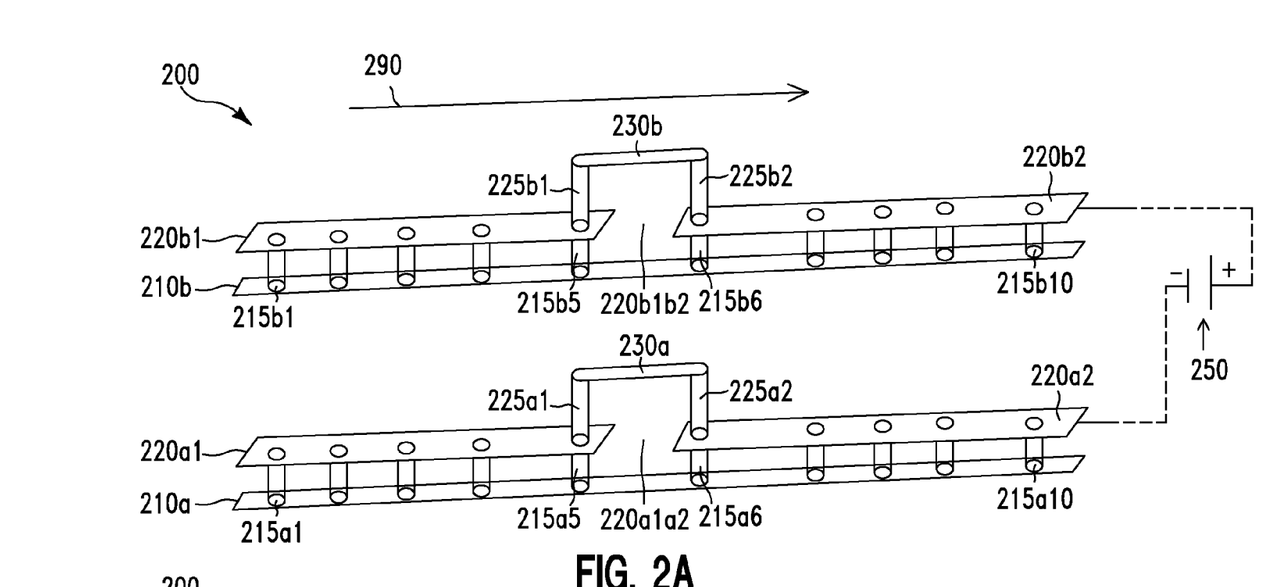
FIG. 2A depicts a design structure comprising a perspective view of a structure, in accordance with embodiments of the present invention.

FIG. 2A depicts a design structure comprising a perspective view of a structure 200, in accordance with embodiments of the present invention. The structure 200 of the FIG. 2A is similar to the structure 100 of FIG. 1A, except as follows. Firstly, M1 line 220a is divided into two M1 line segments 220a1 and 220a2 by a gap 220a1a2 which is located between the two contact regions 215a5 and 215a6. Secondly, M1 line 220b is divided to two M1 line segments 220b1 and 220b2 by a gap 220b1b2 which is located between the two contact regions 215b5 and 215b6. There is no relationship between the lengths of the M1 line segments and their proximity to the power supply 250.

In addition, the structure 200 further comprises two M2 lines 230a and 230b (also called bridges 230a and 230b) and four vias 225a1, 225a2, 225b1, and 225b2. The two M2 lines 230a and 230b run in the first direction 190. The M2 line 230a electrically connects the two M1 line segments 220a1 and 220a2 together through the vias 225a1 and 225a2. In other words, the M2 line 230a bridges the gap 220a1a2 between the two M1 line segments 220a1 and 220a2. Similarly, the M2 line 230b electrically connects the two M1 line segments 220b1 and 220b2 together through the vias 225b1 and 225b2. In other words, the M2 line 230b bridges the gap 220b1b2 between the two M1 lines segments 220b1 and 220b2. The four vias 215a1, 215a2, 215b1, and 215b2 and the two M2 lines 230a and 230b can comprise copper.

Figure 2B:
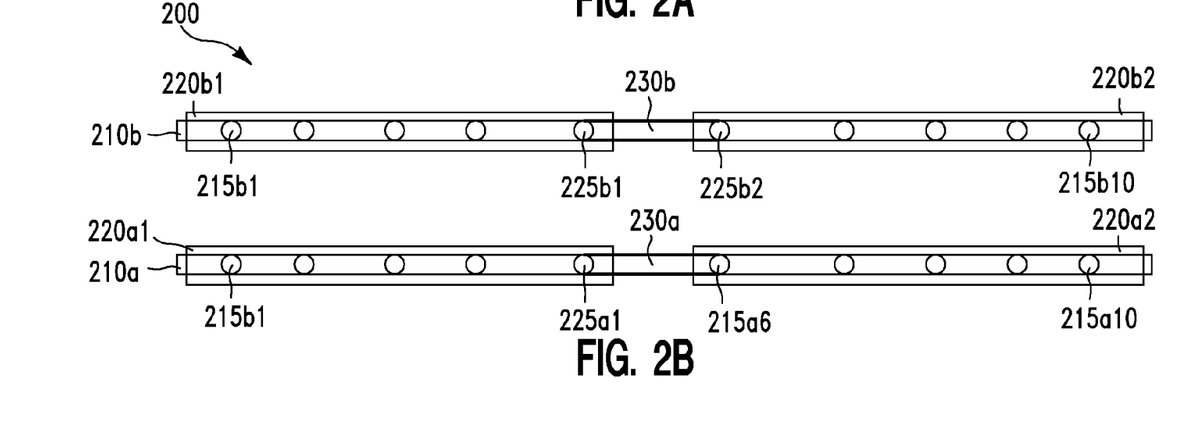
FIG. 2B depicts a design structure comprising a top down view of the structure of FIG. 2A, in accordance with embodiments of the present invention.

FIG. 2B depicts a design structure comprising a top down view of the structure 200 of FIG. 2A, in accordance with embodiments of the present invention.

With reference to FIGS. 2A and 2B, assume that there is a DC power supply 250 electrically connected to the structure 200 as shown. Then, the resulting electron current flow in the structure 200 is similar to that in the structure 100 of FIG. 1A except as follows. Firstly, the electron current flows from the M1 line segment 220a2 to the M1 line segment 220a1 through the bridge 230a. Secondly, the electron current flows from the M1 line segment 220b1 to the M1 line segment 220b2 through the bridge 230b.

Due to the short-length effect, it would be more difficult for the electromigration effect to occur in the M1 line segments 220a1, 220a2, 220b1, and 220b2 of the FIG. 2A than in the M1 lines 120a and 120b of the FIG. 1A, because the M1 line segments 220 of the FIG. 2A are shorter than the M1 lines 120 of the FIG. 1A. The short-length effect is a phenomenon in which the shorter a metal line is, the more difficult for the electromigration effect to occur in that metal line.

Figure 3A:
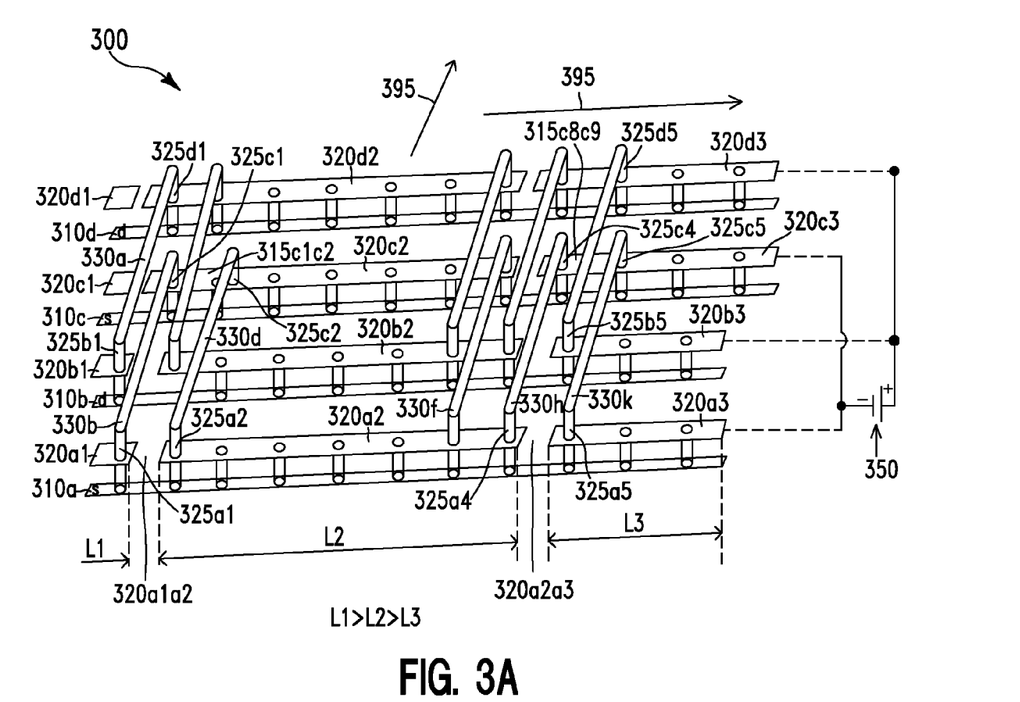
FIG. 3A depicts a design structure comprising a perspective view of a structure, in accordance with embodiments of the present invention.

FIG. 3A depicts a design structure comprising a perspective view of a structure 300, in accordance with embodiments of the present invention. The structure 300 of the FIG. 3A is similar to the structure 200 of FIG. 2A, except as follows. There are two pairs of source and drain regions (as shown in FIG. 2A), each of the two pairs is similar to the pair of source and drain regions of FIG. 1A. M1 line 320a is divided into three M1 line segments 320a1, 320a2 and 320a3 by two gaps: (i) a gap 330a1a2 which is located between the contact region 315a1 and 315a2 and (ii) a gap 330a2a3 which is located between the contact region 315a8 and 315a9. Similarly, M1 line 320b is divided into three M1 line segments 320b1, 320b2 and 320b3 by two gaps as shown in FIG. 3A. M1 line 320c is divided into three M1 line segments 320c1, 320c2 and 320c3 by two gaps as shown in FIG. 3A. M1 line 320d is divided into three M1 line segments 320d1, 320d2 and 320d3 by two gaps as shown in FIG. 3A.

Assume that there is a DC power supply 350 electrically connected to the structure 300 as shown. In one embodiment, for M1 line segments that are electrically coupled to the same source/drain (S/D) regions via the contact regions, the closer to the DC power supply 350 an M1 line segment is, the shorter that M1 line segment is. For example, the length L1 of the M1 line segment 320a1 is greater than the length L2 of the M1 line segment 320a2, which is in turn greater than the length L3 of the M1 line segment 320a3 (i.e., L1>L2>L3). As a result, compared with the M1 line dividing scheme of FIG. 2A, the M1 line dividing scheme of FIG. 3A is better because the M1 line dividing scheme of FIG. 3A gives more ability to withstand the electromigration effect to the line segments which are closer to the DC power supply 350.

In addition, the structure 300 further comprises multiple M2 lines (e.g., 330a, 330b, 330c, 330d, 330h, and 330k). FIG. 3A shows ten M2 lines 330 in total. The ten M2 lines 330 run in a second direction 395, which is perpendicular to the first direction 190. The two M2 lines 330b and 330d help bridge the gap 320a1a2 between the M1 line segments 320a1 and 320a2. Similarly, the two M2 lines 330h and 330k help bridge the gap 320a2a3 between the M1 line segments 320a2 and 320a3. The structure 300 further comprises twenty vias 325a1-325a5, 325b1-325b5, 325c1-325c5, and 325d1-325d5. The ten M2 lines 330 and the twenty vias 325 can comprise copper.

Figure 3B:
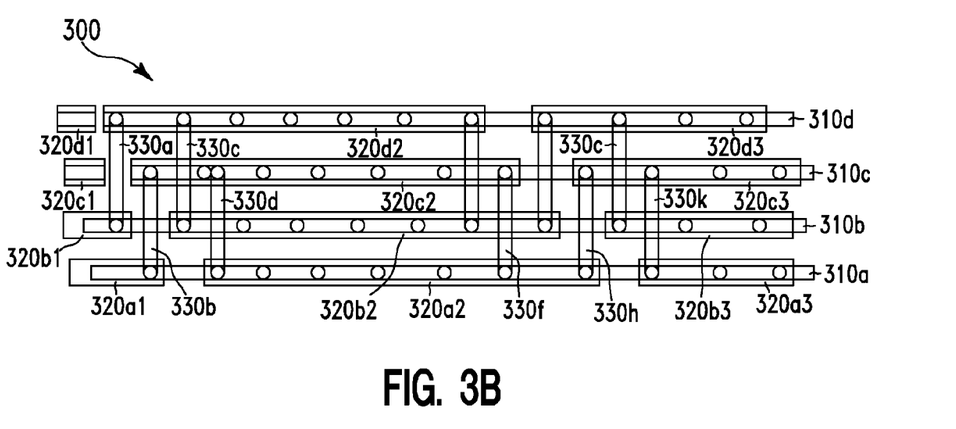
FIG. 3B depicts a design structure comprising a top down view of the structure of FIG. 3A, in accordance with embodiments of the present invention.

FIG. 3B depicts a design structure comprising a top down view of the structure 300, in accordance with embodiments of the present invention.

With reference to FIGS. 3A and 3B, the electron current flow in the structure 300 is similar to that in the structure 200 of FIG. 2A except as follows. The electron current can flow from the M1 line segment 320a3 to the M1 line segment 320a2 through via 325a5, the bridge 330k, the via 325c5, the M1 line portion 315c8c9, the via 325c4 the M2 line bridge 330h, and the via 325a4, in that order. Similarly, the electron current can flow from the M1 line segment 320a2 to M1 line segment 320a1 through the via 325a2, the bridge 330d, the via 325c2, the M1 line portion 315c1c2, the via 325c1, the M2 line bridge 330b, and the via 325a1, in that order.

Figure 4A:
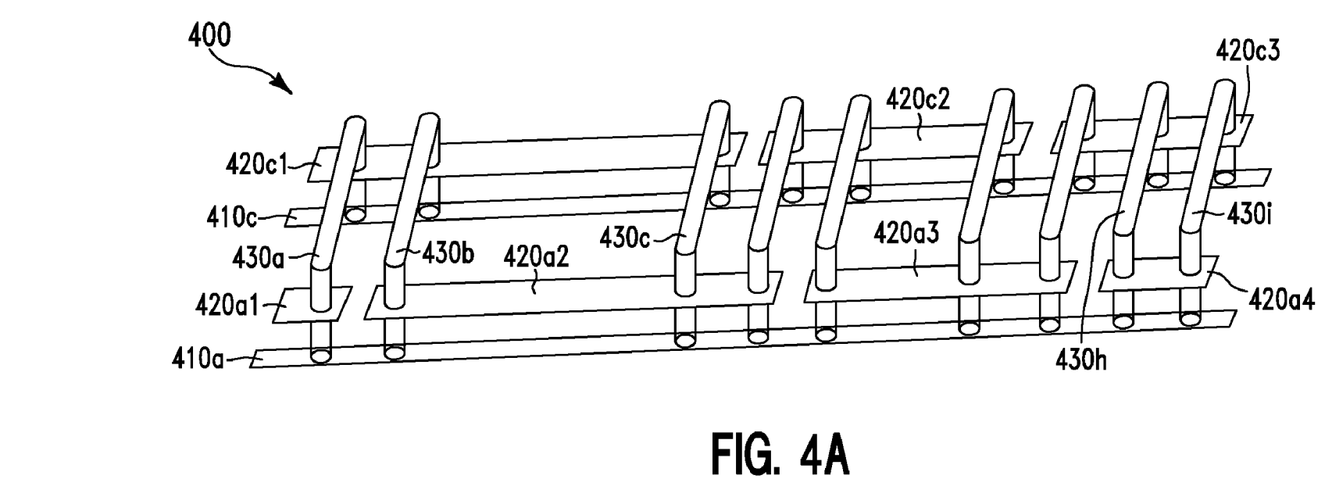
FIG. 4A depicts a design structure comprising a perspective view of a structure, in accordance with embodiments of the present invention.

FIG. 4A depicts a design structure comprising a perspective view of a structure 400, in accordance with embodiments of the present invention. The structure 400 of the FIG. 4A is similar to the structure 300 of FIG. 3A in terms of (i) M1 line dividing scheme (i.e., M1 line segment that is closer to the power supply is shorter) and (ii) gap bridging scheme (i.e., crossing a gap by traveling through a detour comprising two M2 lines which are perpendicular to M1 line).

As shown in FIG. 4A, it should be noted that all the M2 lines are connected to the same two source/drain regions of structure 400. In one embodiment, if both first and second M2 lines are electrically connected to a first source/drain region and if the first M2 line is electrically connected to a second source/drain region, then the second M2 line is also electrically connected to the second source/drain region.

Figure 4B:
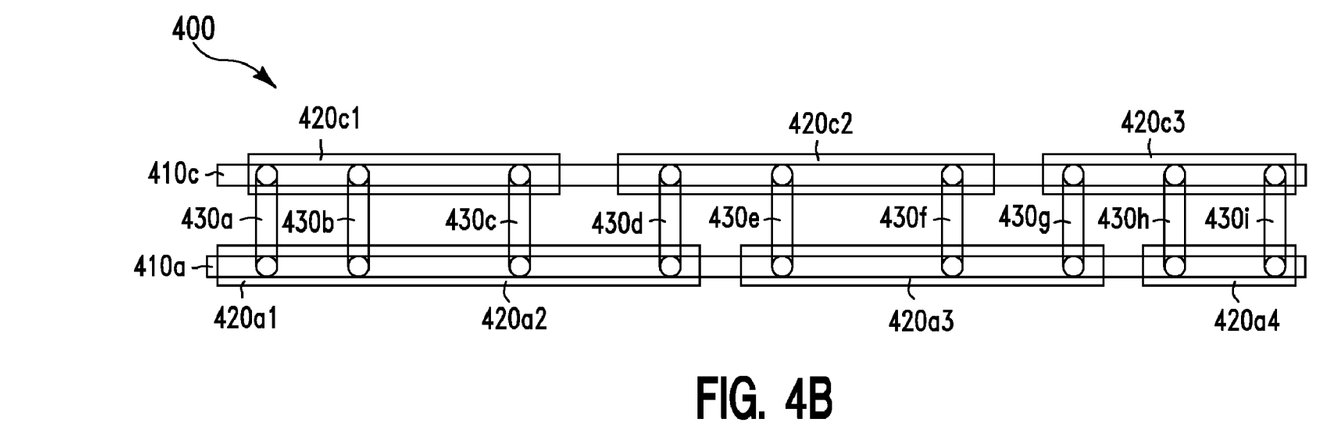
FIG. 4B depicts a design structure comprising a top down view of the structure of FIG. 4A, in accordance with embodiments of the present invention.

FIG. 4B depicts a design structure comprising a top down view of the structure 400, in accordance with embodiments of the present invention.

Figure 5A:
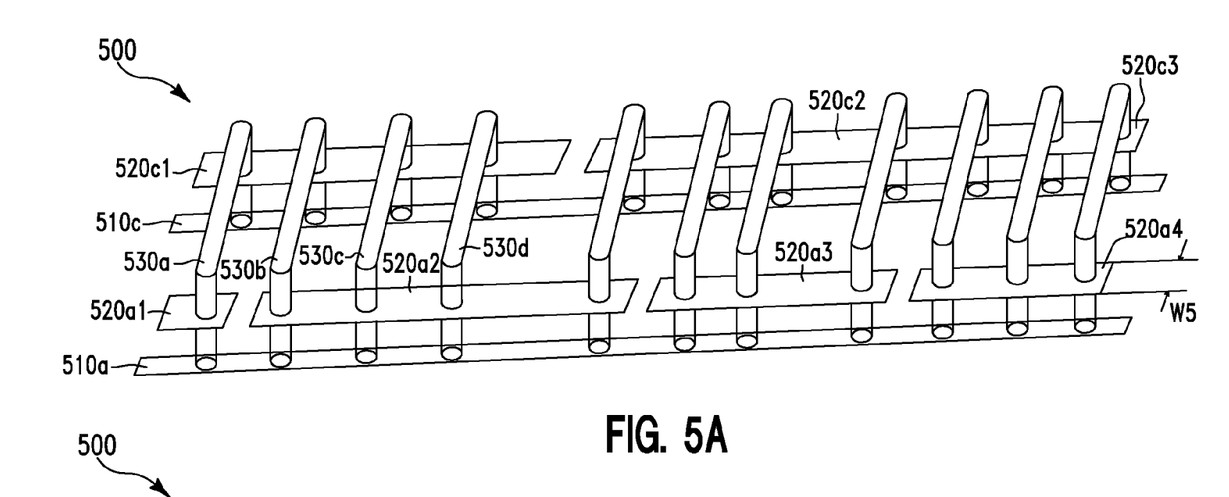
FIG. 5A depicts a design structure comprising a perspective view of a structure, in accordance with embodiments of the present invention.

FIG. 5A depicts a design structure comprising a perspective view of a structure 500, in accordance with embodiments of the present invention. The structure 500 of the FIG. 5A is similar to the structure 400 of FIG. 4A in terms of (i) M1 line dividing scheme (i.e., M1 line segment that is closer to the power supply is shorter) and (ii) gap bridging scheme (i.e., crossing a gap by traveling through a detour comprising multiple M2 lines which are perpendicular to M1 line), except as follows. There are three M2 lines 530b, 530c, and 530d that are electrically connected between the M1 line segments 520a2 and 520c1 of FIG. 5A, whereas there are only two M2 lines 430b and 430c that are electrically connected between the M1 line segments 420a2 and 420c1 of FIG. 4A. Therefore, the operation of the structure 500 is more reliable than the operation of the structure 400 of FIG. 4A.

Figure 5B:
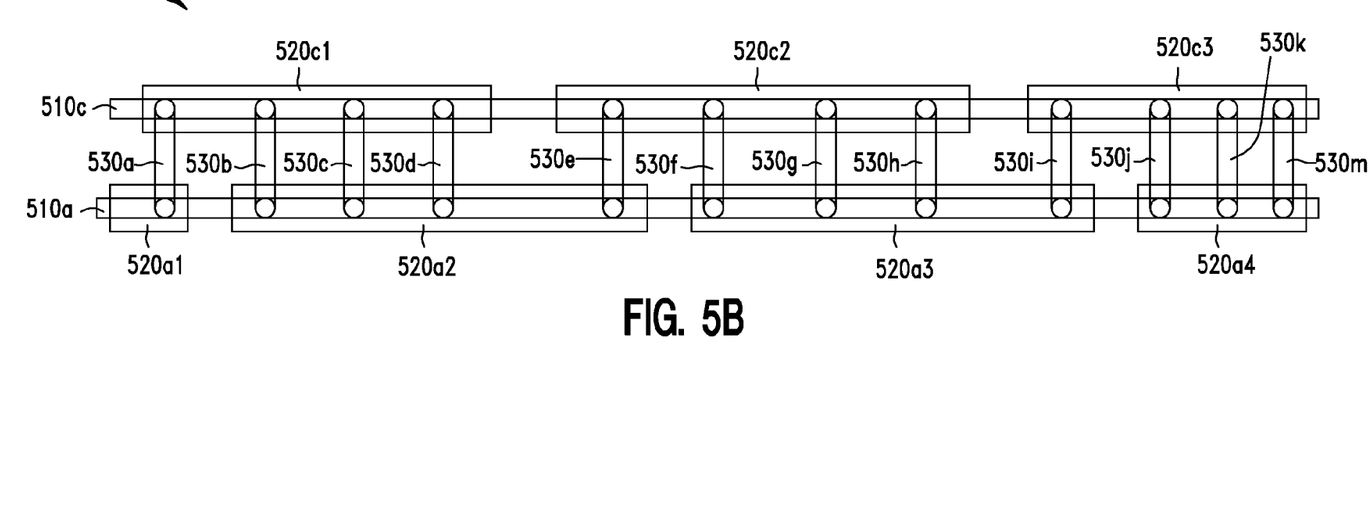
FIG. 5B depicts a design structure comprising a top down view of the structure of FIG. 5A, in accordance with embodiments of the present invention.

FIG. 5B depicts a design structure comprising a top down view of the structure 500, in accordance with embodiments of the present invention.

Figure 6A:
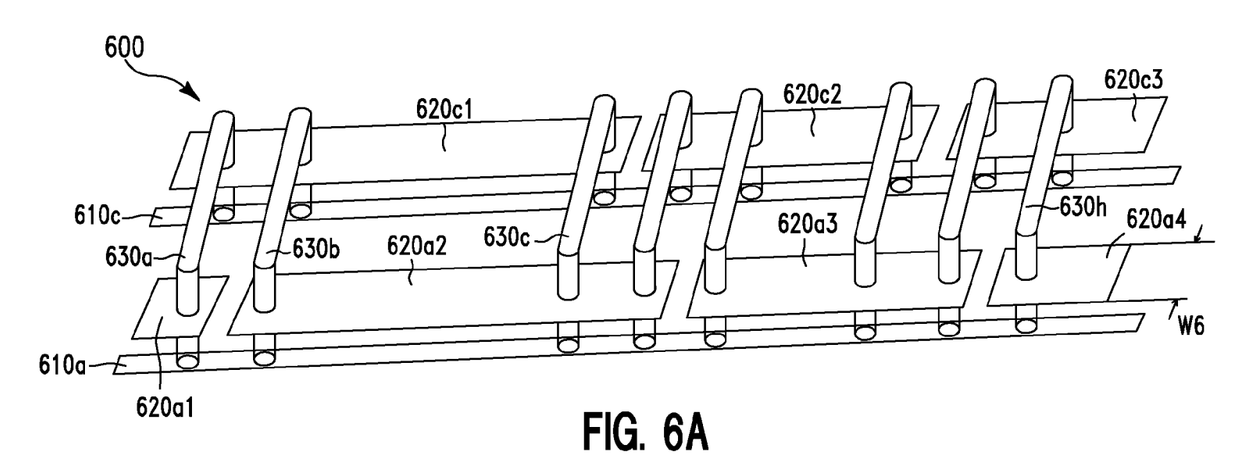
FIG. 6A depicts a design structure comprising a perspective view of a structure, in accordance with embodiments of the present invention.

FIG. 6A depicts a design structure comprising a perspective view of a structure 600, in accordance with embodiments of the present invention. The structure 600 of the FIG. 6A is similar to the structure 400 of FIG. 4A except as follows. The width W6 of the M1 line segments 620 is greater than the width W5 of the M1 line segments 520.

Figure 6B:
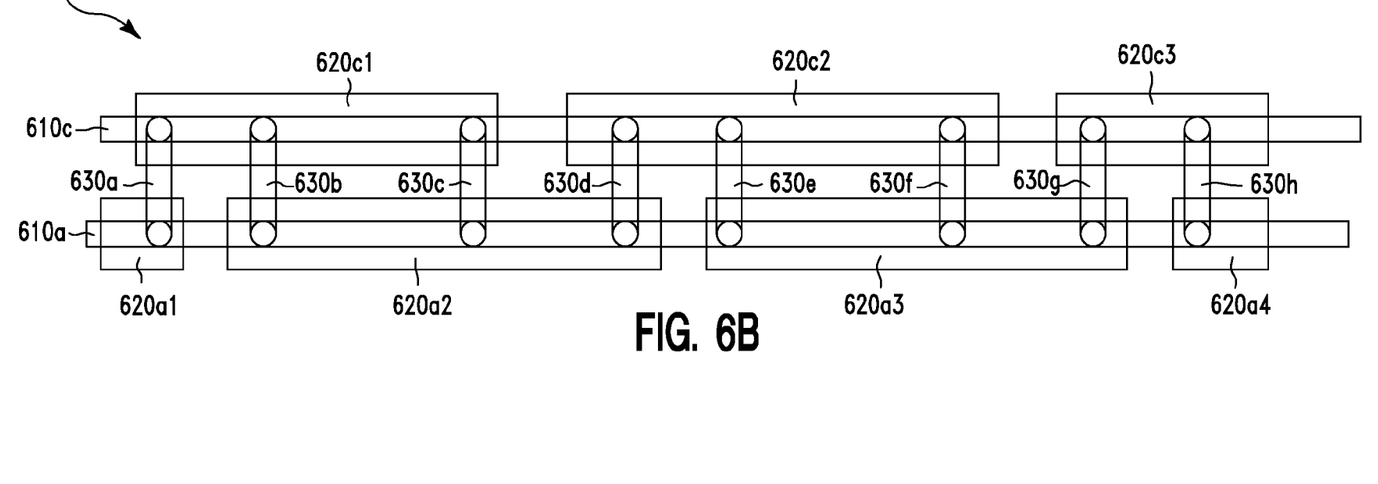
FIG. 6B depicts a design structure comprising a top down view of the structure of FIG. 6A, in accordance with embodiments of the present invention.

FIG. 6B depicts a design structure comprising a top down view of the structure 600, in accordance with embodiments of the present invention.

In summary, the M1 line dividing schemes of FIGS. 3A, 4A, 5A, and 6A give more ability to withstand electromigration effect to the line segments which are closer to the DC power supply. The gap bridging scheme of FIG. 2A provides a detour which comprises a bridge in the same orientation as that of the M1 line segments. The gap bridging schemes of FIGS. 3A, 4A, and 5A provide detours which comprise bridges whose orientation is perpendicular to the orientation of the M1 line segments.

In the embodiments described above, it should be noted that the M1 and M2 lines are formed in a first and second interconnect layers, respectively, of a semiconductor integrated circuit (i.e., chip) (not shown). The second interconnect layer is immediately above the first interconnect layer.

In the embodiments described above, the metal lines that run laterally in the interconnect layers (e.g., M1 line 120a and 120 of FIG. 1A) can comprise aluminum or copper. For aluminum metallization, the vias between metal levels (e.g., the via 225a1 of FIG. 2A) can comprise either tungsten (W) or Al, whereas the metal lines can comprise Al alloys, such as AlCu, AlSi, AlCuSi, with or without refractory metal under and over layers such as TiW, Ti, TiAl3, TiN, etc. The Al lines could be either RIE or damascene. For Cu metallization, the metal lines can comprise Cu with various forms of Ta-based liners, and single or dual damascene metal.

In the embodiments described above, only 2 metal levels M1 and M2 are described. In general, the present invention can be applied to any number of metal levels. As a result, to cross a gap in a metal level, the current can go up one or more metal levels and then go down to the original metal level.

In the embodiments described above, only two power transistors are described (FIG. 3A). In general, the present invention can be applied to any number of power transistors whose source/drain regions are arranged next to one another as in FIG. 3A. As a result, to cross a gap overhead a S/D region, the current can go laterally to any metal line overhead any S/D region and then go back to overhead the original S/D region.

In the embodiments described above, the present invention is applied to power transistors (e.g., power transistor 110a+ 110b of FIG. 1A). In general, the present invention can be applied to hot regions of an integrated circuit (IC). More specifically, there are hot regions in an integrated circuit where temperatures are higher than elsewhere of the IC. Metal lines running close to these hot regions are more vulnerable to electromigration than others elsewhere. As a result, these metal lines can be divided up using the dividing scheme of the present invention (i.e., divided into segments whose lengths become shorter when coming closer to a hot region). The divided segments can be electrically connected together using the bridging schemes of the present invention (described above). As a result, the divided segments have more ability to withstand electromigration when coming closer to hot regions.

Figure 7:
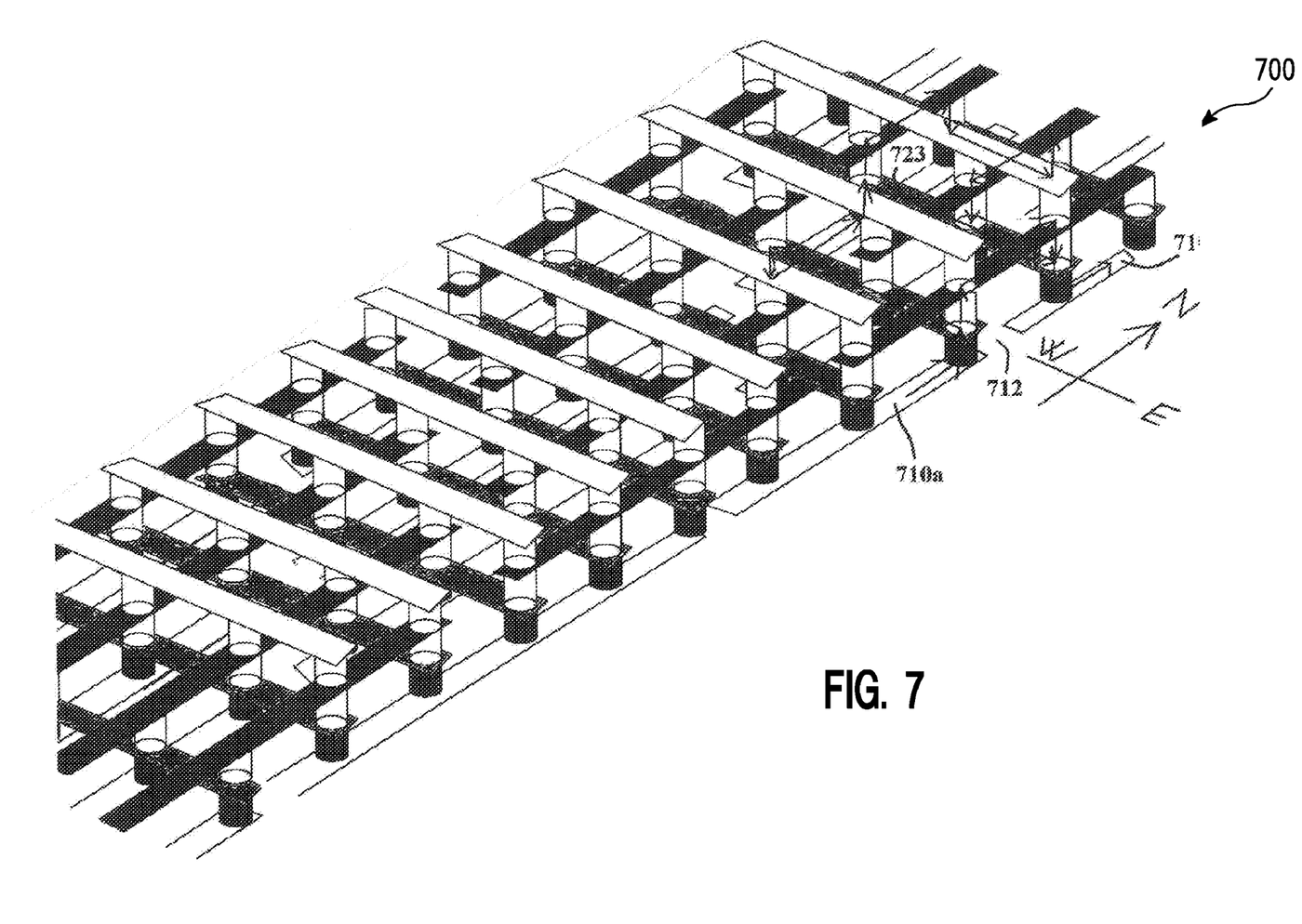
FIG. 7 depicts a design structure comprising a perspective view of a structure, in accordance with embodiments of the present invention.

FIG. 7 depicts a design structure comprising a perspective view of a structure 700, in accordance with embodiments of the present invention. The structure 700 comprises illustratively 4 metal levels namely the first, second, third, and fourth metal levels (from bottom up). Assume that the metal lines in the first and third metal levels run in the north-south direction, whereas the metal lines in the second and fourth metal levels run in the east-west direction.

Assume that an electron current is to flow from a line segment 710a to a line segment 710b (i.e., cross the gap 712). The arrows represent the possible paths which the electron current can take. More specifically, the electron current can flow north in the line segment 710a, then flow up to the second metal level, then flow west 2 portions, then flow down to the first metal level, then flow north 1 portion, then flow up the second level, then flow east 2 portions, then flow down to the first level, and then flow north in the line segment 710b.

Alternatively, the electron current can flow north in the line segment 710a, then flow up to the second metal level, then flow up to the third metal level, then flow north 1 portion, then flow down to the second metal level, then flow down to the first metal level, and then flow north in the line segment 710*b*.

Assume that there is a gap at a location 723 which blocks the original path of the electron current described above. Then, to cross the gap 723, the electron current can detour from the original path and flow up to the third metal level, then flow north 1 portion, then flow down to the second metal level, then flow east 1 portion, then flow up to the third metal level, then flow south 1 portion, and then flow down to the second metal level to continue on the original path.

The use of the short-length effect, as described by I. Blech (JAP 47 (4) 1203-1208 (1976)), to increase the electromigration robustness of a metal line has been proposed for several years. But it is difficult to utilize the Blech scheme generally in chip design due to restrictions imposed by design tools which have wiring algorithms that automatically connect pre-designed blocks of circuitry. Only in the application of power distribution grids that cover most of the chip is it feasible to try such schemes as set forth in the Filippi patent (U.S. Pat. No. 6,202,191). However, special situations arise where portions of a chip develop much higher currents or temperatures than the rest of the chip, and local wiring designs can substantially augment the current-carrying capability of the metallization. The present invention deals with these special situations.

Figure 8:
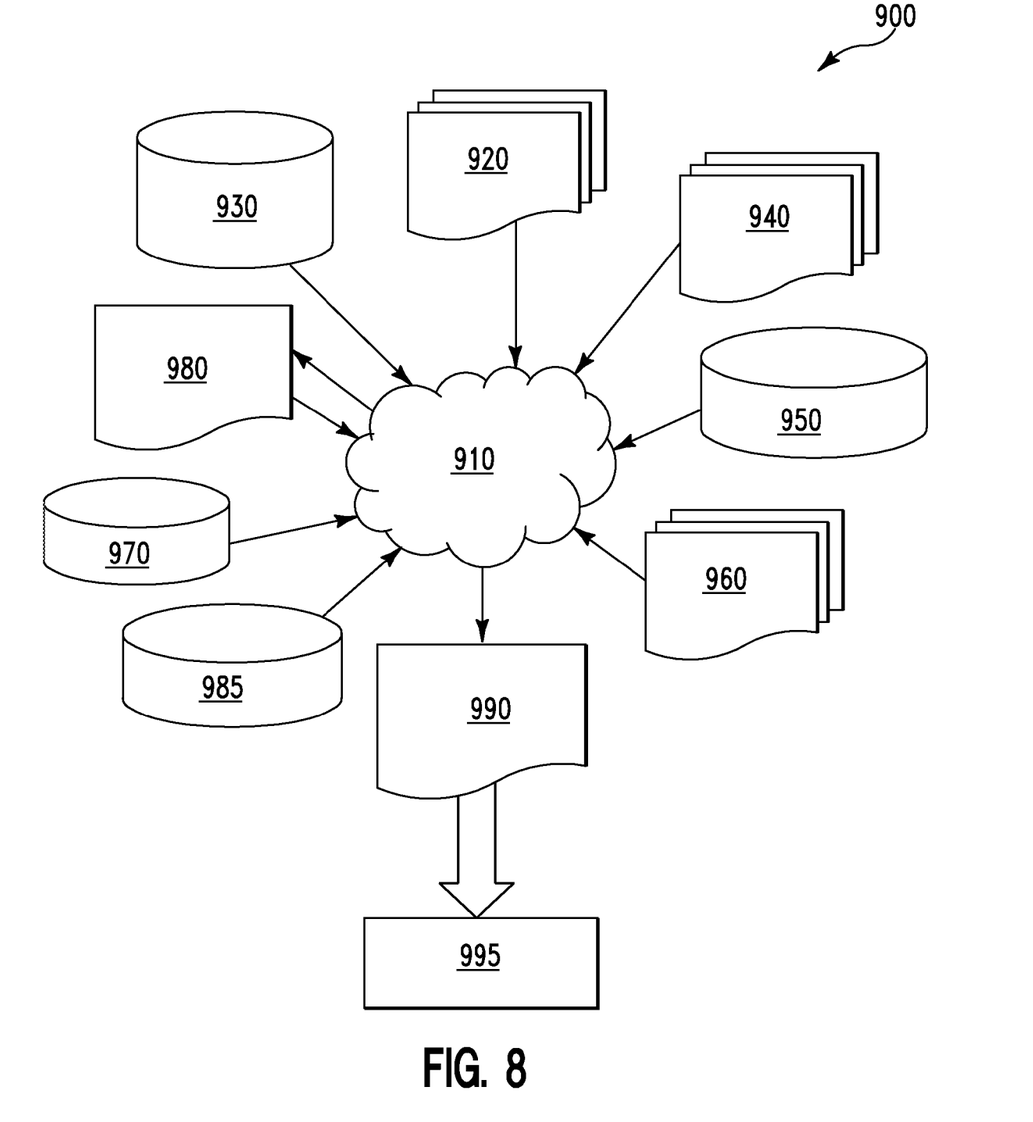
FIG. 8 shows a diagram of an exemplary design flow process in which the design structure of the present invention is processed into a form useful for developing and manufacturing integrated circuits in which metal lines are less vulnerable to electromigration effect than those of the prior art.

FIG. 8 shows a block diagram of an example design flow 900. The design flow 900 may vary depending on the type of IC being designed. For example, a design flow 900 for building an application specific IC (ASIC) may differ from a design flow 900 for designing a standard component. Design structure 920 is preferably an input to a design process 910 and may come from an IP provider, a core developer, or other design company or may be generated by the operator of the design flow, or from other sources. The design structure 920 comprises the structure 100 of FIG. 1A (or the circuit 200, 300, . . . , or 700 of FIG. 2A, 3A, . . . , or 7, respectively) in the form of schematics or HDL, a hardware-description language (e.g., Verilog, VHDL, C, etc.). The design structure 920 may be contained on one or more machine readable medium. For example, the design structure 920 may be a text file or a graphical representation of the structure 100 of FIG. 1A. The design process 910 preferably synthesizes (or translates) the structure 100 of FIG. 1A into a netlist 980, where the netlist 980 is, for example, a list of wires, transistors, logic gates, control circuits, I/O, models, etc. that describes the connections to other elements and circuits in an integrated circuit design and recorded on at least one of machine readable medium. This may be an iterative process in which the netlist 980 is resynthesized one or more times depending on design specifications and parameters for the circuit.

The design process 910 may include using a variety of inputs; for example, inputs from library elements 930 which may house a set of commonly used elements, circuits, and devices, including models, layouts, and symbolic representations, for a given manufacturing technology (e.g., different technology nodes, 32 nm, 45 nm, 90 nm, etc.), design specifications 940, characterization data 950, verification data 960, design rules 970, and test data files 985 (which may include test patterns and other testing information). The design process 910 may further include, for example, standard circuit design processes such as timing analysis, verification, design rule checking, place and route operations, etc. One of ordinary skill in the art of integrated circuit design can appreciate the extent of possible electronic design automation tools and applications used in the design process 910 without deviating from the scope and spirit of the invention. The design structure of the invention is not limited to any specific design flow.

Ultimately, the design process 910 preferably translates the structure 100 of FIG. 1A, along with the rest of the integrated circuit design (if applicable), into a final design structure 990 (e.g., information stored in a GDS storage medium). The final design structure 990 may comprise information such as, for example, test data files, design content files, manufacturing data, layout parameters, wires, levels of metal, vias, shapes, test data, data for routing through the manufacturing line, and any other data required by a semiconductor manufacturer to produce the structure 100 of FIG. 1A. The final design structure 990 may then proceed to a stage 995 where, for example, the final design structure 990 proceeds to tape-out, is released to manufacturing, is sent to another design house, or is sent back to the customer.

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

The invention claimed is:

1. A design structure embodied in a non-transitory machine readable medium used in a design process, the design structure comprising an integrated circuit, wherein the integrated circuit includes:
   a substrate;
   a first electrically conductive line segment, a second electrically conductive line segment, and a third electrically conductive line segment on the substrate,
      wherein the first, second, and third electrically conductive line segments run in a reference direction, and
      wherein the first, second, and third electrically conductive line segments reside in a first interconnect layer of the integrated circuit,
      wherein a length L1 of the first electrically conductive line segment in the reference direction is greater than a length L2 of the second electrically conductive line segment in the reference direction, and
      wherein the length L2 is greater than a length L3 of the third electrically conductive line segment in the reference direction;
   an electrically conductive line electrically coupled to the first and second electrically conductive line segments through a first via and a second via, respectively,
      wherein the electrically conductive line resides in a second interconnect layer of the integrated circuit,
      wherein the second interconnect layer is above the first interconnect layer, and
      wherein the electrically conductive line runs in the reference direction; and
   an electrical structure formed within a third interconnect layer residing below said first electrically conductive line segment and said second electrically conductive line segment and between said first interconnect layer and said substrate,
      wherein said electrical structure is directly electrically and mechanically connected to said first electrically conductive line segment and said second electrically conductive line segment.

2. The design structure of claim 1, wherein the design structure comprises a netlist, which describes the integrated circuit.

3. The design structure of claim 1, wherein the design structure resides on a GDS storage medium.

4. The design structure of claim 1, wherein the design structure includes at least one of test data files, characterization data, verification data, or design specifications.

5. A design structure embodied in a non-transitory machine readable medium used in a design process, the design structure comprising an integrated circuit, wherein the integrated circuit includes:

a substrate;

a first electrically conductive line segment, a second electrically conductive line segment, a third electrically conductive line segment, and a fourth electrically conductive line segment on the substrate;

wherein the first, second, third, and fourth electrically conductive line segments reside in a first interconnect layer of the integrated circuit, wherein the first, second, third, and fourth electrically conductive line segments run in a first reference direction, wherein a length L1 of the first electrically conductive line segment in the first reference direction is greater than a length L2 of the second electrically conductive line segment in the first reference direction, and wherein the length L2 is greater than a length L3 of the fourth electrically conductive line segment in the first reference direction;

a first electrically conductive line and a second electrically conductive line, wherein the first and second electrically conductive lines reside in a second interconnect layer of the integrated circuit, wherein the first electrically conductive line is electrically coupled to the first and third electrical conductive line segments in the first interconnect layer through a first via and a second via, respectively, wherein the second electrically conductive line is electrically coupled to the second and third electrically conductive line segments in the first interconnect layer through a third via and a fourth via, respectively, wherein the second interconnect layer is above the first interconnect layer, wherein the first and second electrically conductive lines run in a second reference direction, and wherein the first and second reference directions are perpendicular; and an electrical structure formed within a third interconnect layer residing below said first electrically conductive line segment, said second electrically conductive line segment, and said substrate, wherein said electrical structure is directly electrically and mechanically connected to said first electrically conductive line segment and said second electrically conductive line segment.

* * * * *